(12) United States Patent
Brotzman et al.

(10) Patent No.: US 10,033,015 B1
(45) Date of Patent: Jul. 24, 2018

(54) FLEXIBLE, OPTICALLY CLEAR, COMPOSITE STRUCTURES FOR FOLDABLE DISPLAYS IN MOBILE DEVICES

(71) Applicant: Motorola Mobility LLC, Chicago, IL (US)

(72) Inventors: Richard Brotzman, Naperville, IL (US); Deborah M. Paskiewicz, Downers Grove, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 15/482,149

(22) Filed: Apr. 7, 2017

(51) Int. Cl.
| | |
|---|---|
| *B32B 7/12* | (2006.01) |
| *B32B 27/06* | (2006.01) |
| *H01L 51/52* | (2006.01) |
| *B32B 37/12* | (2006.01) |
| *G02B 1/14* | (2015.01) |
| *H01L 51/56* | (2006.01) |

(52) U.S. Cl.
CPC ............ *H01L 51/5275* (2013.01); *B32B 7/12* (2013.01); *B32B 27/06* (2013.01); *B32B 37/12* (2013.01); *G02B 1/14* (2015.01); *H01L 51/5253* (2013.01); *H01L 51/56* (2013.01); *B32B 2307/412* (2013.01); *B32B 2307/542* (2013.01); *B32B 2309/105* (2013.01); *B32B 2457/20* (2013.01); *H01L 2251/5338* (2013.01); *H01L 2251/558* (2013.01)

(58) Field of Classification Search
CPC ............ H01L 2251/5338; C09J 175/08; C09J 2203/318; B32B 7/12; B32B 27/06
See application file for complete search history.

(56) References Cited

U.S. PATENT DOCUMENTS

| | | | | |
|---|---|---|---|---|
| 2002/0098353 | A1* | 7/2002 | Kollaja ................... | C08L 23/10 428/355 AC |
| 2003/0211333 | A1* | 11/2003 | Watanabe ................ | B32B 7/02 428/422.8 |
| 2008/0057216 | A1* | 3/2008 | Shintani .................... | C09J 7/22 427/487 |
| 2013/0273267 | A1* | 10/2013 | Niiyama ................... | C09J 4/00 428/1.55 |
| 2015/0314573 | A1* | 11/2015 | Niiyama .................. | B32B 7/12 428/78 |

\* cited by examiner

*Primary Examiner* — Benjamin Sandvik
*Assistant Examiner* — Gustavo Ramallo
(74) *Attorney, Agent, or Firm* — Kunzler, PC

(57) ABSTRACT

For a flexible, optically clear display stack, an adhesive, a system, and a method are provided. The adhesive is formed of polymer chains, at least a portion of which are cross-linked, a non-volatile diluent having a volume % in the range of between about 40 and 95, and is characterized with a low shear modulus of less than 10 kPa. The system is formed by at least first and second optically clear thin films with the adhesive disposed between the first and second thin films. The method includes the steps to form the system.

20 Claims, 18 Drawing Sheets

FLEXIBLE, OPTICALLY CLEAR, COMPOSITE STRUCTURES FOR FOLDABLE DISPLAYS IN MOBILE DEVICES

BACKGROUND

Field

The subject matter disclosed herein relates to foldable mobile device form factors and more particularly relates to exterior foldable displays for mobile devices.

Description of the Related Art

Foldable mobile device form factors require novel display stacks capable of 100,000+ bending cycles, and exterior displays require a lens that protects the flexible pOLED display from abrasion, denting, and impacts. Typically, a pOLED display stack is comprised of the following layers adhered together: pOLED, touch, optical films, and lens system. While each element in the display stack can independently bend to relatively tight radii (i.e. <5 mm) as a thin film, when bonded together and bent, intermediate to high modulus films form cylindrical loops 102 which delaminate and buckle due to tensile 104 and compressive forces 106 present in the laminated film stack (see FIG. 1).

Adhesive manufacturers attempt to address this challenge by making the adhesive thinner. However, although the adhesive layer is thin and can bend as a film to a radius of <5 mm, the adhesive dynamic shear and tensile moduli are too high and transfer mechanical stress between bonded layers causing delamination and buckling of bonded stack layers. Existing adhesives cannot mechanically isolate elements of the display stack, thus plastic set of the stack occurs during bend cycle testing.

BRIEF SUMMARY

A method for forming an innovative adhesive is disclosed. The adhesive enables elements of a display stack to be bonded together and bent to a radius of <5 mm without delamination and buckling, and is an essential element in the display stack, which protects a flexible pOLED display from dents and impacts. A display stack implementing the product of the method is also disclosed.

In one embodiment, the adhesive is formed of polymer chains, at least a portion of which are cross-linked, and a non-volatile diluent having a volume % in the range of between about 40 and 95. Additionally, the adhesive is characterized by a shear modulus of less than 10 kPa. In one embodiment, the polymer chains are selected from the group consisting of an acrylate polymer, and a silicone polymer. The non-volatile diluent may be selected from the group consisting of diphenyl-dimethylsiloxane copolymer, butyl-terminated polydimethylsiloxane, and an alkane with pendant alkyl groups.

In one embodiment, the adhesive has a thickness of less than 0.5 mm, or less than 0.2 mm. In a further embodiment, the adhesive is characterized by a shear module of less than 5 kPa, or less than 3 kPa. Additionally, the volume % of the non-volatile diluent may be in the range of between about 70 and 85, or alternatively, may be about 80.

The display stack formed by implementing the method includes a first thin film comprising an optically clear polymeric material, and a second thin film comprising an optically clear polymeric material. The above-described adhesive may be optically clear and is used to adhere the first thin film to the second thin film while allowing the films to remain mechanically isolated from one another.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
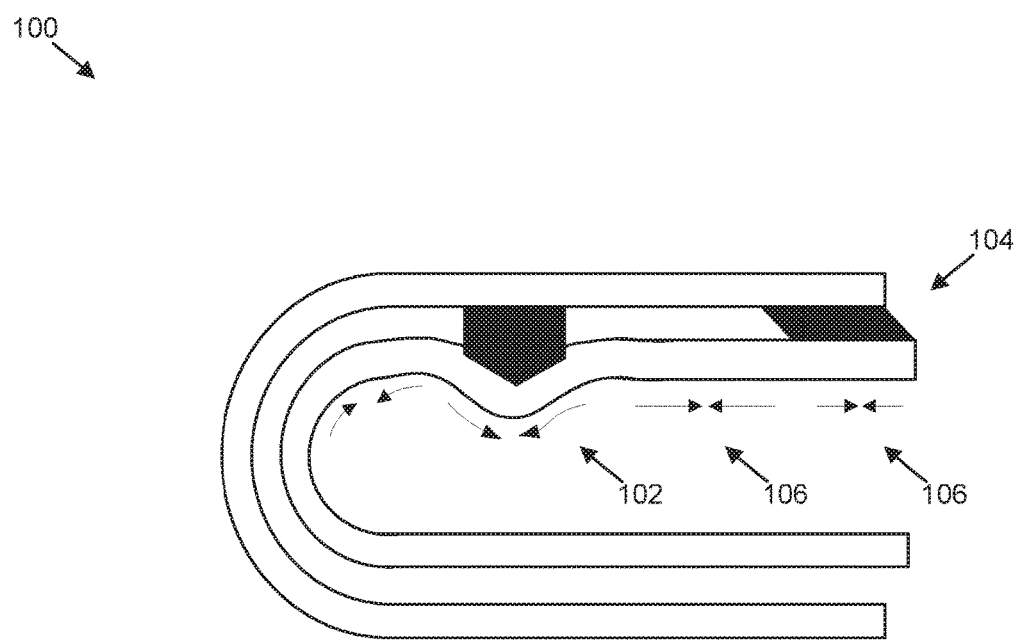
FIG. 1 is a schematic diagram illustrating one embodiment of a foldable display stack that has buckled in accordance with the prior art.

Described herein are methods and systems for providing an adhesive formulated to enable a stack of thin films (i.e., display stack) to be bonded together while allowing the individual film layers in the display stack to remain mechanically isolated. This beneficially prevents delamination of the layers and buckling under compression while bending the display stack, especially to a bend radius of <5 mm. The phrase "mechanical isolated" refers to individual film layers that act mechanically as individual elements and are not constrained by adjacent film layers.

As will be described in greater detail below, the described embodiments provide adhesive formulations which reduce the adhesive modulus by decreasing both the cross-link density and molecular constraints on polymer chain and cross-link movement in response to an applied stress. The phrases "cross-link" or "network junction" refer to chemical or physical bonds linking one polymer chain to another; these linked bonds may be a covalent bond or an ionic bond. The phrase "cross-link density" refers to the number of cross-links per volume.

Peel strength is selected to enable a stack of thin films to be bonded together while still mechanically isolated from each other. Unlike other adhesives used by common manufacturers, the below-described adhesives are not limited by an adhesive thickness. Accordingly, thicker adhesives that provide improved shock absorption may be used to prevent mechanical damage to internal layers, such as an internal pOLED. The described embodiments of the current disclosure enable the development of mobile devices with exterior foldable displays.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided to give a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

The schematic flowchart diagrams and/or schematic block diagrams in the Figures illustrate the architecture, functionality, and operation of possible implementations of apparatuses, systems, and methods according to various embodiments. It should also be noted that, in some alternative implementations, the functions noted in the block may occur out of the order noted in the Figures. For example, two blocks shown in succession may, in fact, be performed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

Figure 2:
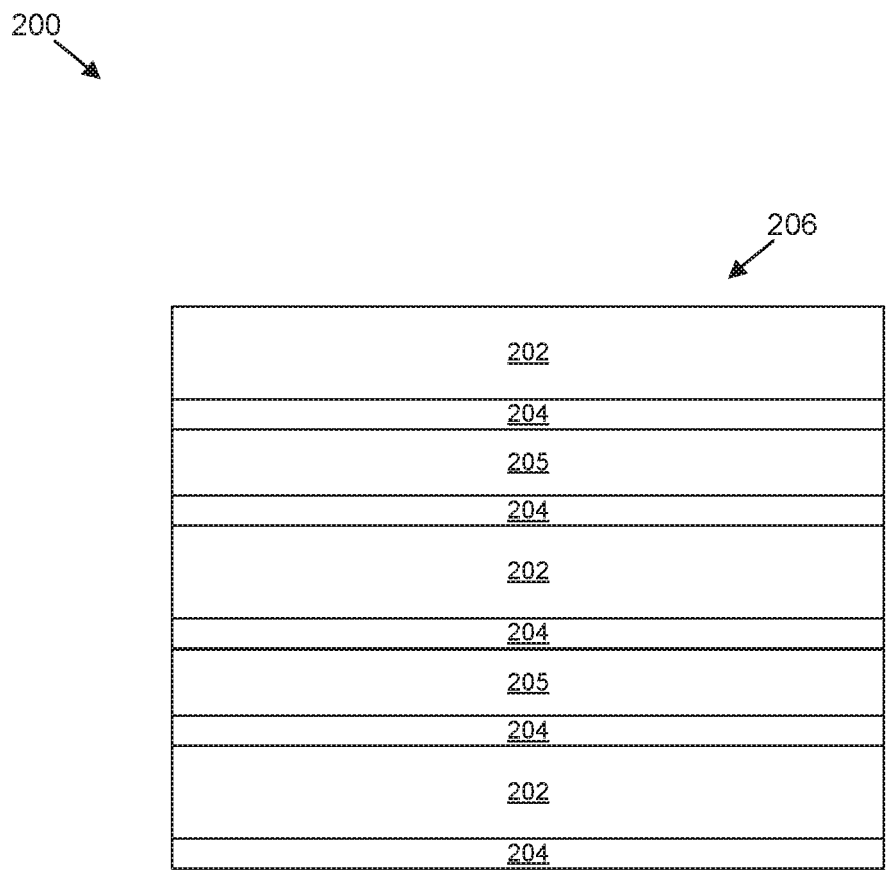
FIG. 2 is a schematic block diagram illustrating one embodiment of a display stack in accordance with embodiments of the present disclosure.

FIG. 2 is a schematic block diagram illustrating one embodiment of a display stack 200 in accordance with embodiments of the present disclosure. The depicted display stack 200 is for illustrative purposes only, as one of skill in the art will recognize that the different layers and coatings may not be to scale. The display stack 200, in one embodiment, is formed with various different thin films 202. Some, or all, of these thin films 202 may be coated with a thin, high modulus hard coats (HC) 204 on one or both sides of each thin film 202. The thin films 202 are adhered together with adhesives 205 having the same or different moduli. In one embodiment, the adhesive in the display stack 200 are tailored in combination with the thin films to reflect and absorb energy from impacts to a surface 206 of the display stack 200 to prevent mechanical damage to display stack 200 elements, such as marring and dents.

In one embodiment, the thin films 202 may be formed from optically clear films such as polymeric materials. These optically clear films may have a thickness of less than 0.10-mm thick, with hard coats 204 on one or both surfaces, and a bend radius of less than 5-mm. Examples of a thin film 202 include, but are not limited to, polyethylene terephthalate (PET), cyclic olefin polymer (COP), cyclic olefin copolymer (COC), polycarbonate (PC), colorless polyimide (CPI), transparent polyamide, and poly(methyl methacrylate) (PMMA). The thin films 202 may also be formed of polymers sheets modified to function as a polarizer or touch layer, or alternatively, may be an encapsulated pOLED with embedded electronic circuitry.

In another embodiment, each hard coat 204 may be a cross-linked polymer, a cross-linked polymer filled with particulates, or preferably a cross-linked polymer filled with nano-sized particulates or particulates with a refractive index that matches the cross-linked polymer. The hard coat 204 may be filled with particulates to produce a highly durable protective coating. The thin, optically clear film 202 with hard coat 204, in one embodiment, has about a 0.5% haze and about 90% transmission, and may be bent to a radius of at least 5-mm without breaking. The term "haze" refers to a percentage of light that is scattered as it passes through a substance. In some embodiments, a low percentage of haze is desirable. The term "transmission" refers to a percentage of light that passes through a substance. In some embodiments, a high percentage of transmission is desirable.

Further, the optically clear film 202 may have a color in a L*a*b* colorimetric system in the range of between about −1.0 to 1.0 for b*. The term "color" is measured on the L*a*b* colorimetric scale where L* ranges from 0 (black) to 100 (white), a*, or a-value, is an integer where a positive value represents red and a negative value represents green, and b*, or b-value, is an integer where a positive value represents yellow and a negative value represents blue.

The clarity of the films 202, 204, may be determined by measuring its haze (reported as a percentage), transmission (reported as a percentage) and/or color (reported according to the L*a*b* colorimetric scale). Haze and transmission may be measured with a transparency meter and/or a haze meter. The clarity of the hard coat 204 may be measured after abrasion to evaluate the amount of protection imparted by the hard coat. A hard coat 204 may be considered to be "optically clear" if it has about 0.5% haze, at least 90% transmission, and a color in a L*a*b* colorimetric system between −1.0 to 1.0 for b*. Additionally, the hard coat 204 may increase the tensile modulus of a plastic substrate (i.e., thin film 202) to at least 4.5 GPa.

In one embodiment, abrasion resistance may be measured by abrading the hard coat 204 with silicon carbide (SiC) using a Taber linear abrader. The hard coat 204 may have a haze of about 20% after abrasion. In other embodiments, the hard coat 204 may have hazes of about 15%, 10%, or 5% after abrasion.

Additional functional coatings may be applied with the hard coat 204 to the flexible plastic substrate (i.e., thin film 202). For example, the thin film 202 may also be coated with an anti-reflective coating, a conductive coating, or a self-healing shape memory polymer ("SMP") coating. The phrase "shape memory polymer" refers to a polymer that can be deformed and subsequently fixed into a temporary shape and remains stable unless it is exposed to an appropriate external stimulus (e.g., direct heat) that triggers the polymer to recover to its original (or permanent) shape. The associated behavior of a SMP is called polymer "shape memory effect" (SME). As used herein, the phrase "self-healing" refers to the recovery of damages (or deformation) that typical plastic goods may experience, such as surface damage (e.g., indents or scratches), under normal usage. Through the mechanism of reverse plastic SME, the plastic deformation recovers or damages are healed by the application of an external force such as heating or electric-active potential, or the activation of embedded reactive microcapsules. The self-healing mechanism repairs only non-permanent damage such as surface scratches.

Examples of thin, optically clear films 202 with hard coats 204 are illustrated in Table 1 as a function of polymer film thickness, abrasion resistance, and bend diameter.

attached to a junction or the junction functionality; ($\mu_j/V_o$), the junction ($\mu_j$) density; and v, the number of chains between network junctions. The phrase "junction functionality" refers to the number of polymer chains emanating from a cross-link of a network junction. The adhesive network parameters are related to the cycle rank of a network ($\xi$) as follows: $\xi=v(\varphi-2)]/\varphi=\mu_j(\varphi-2)/2$.

Figure 3:
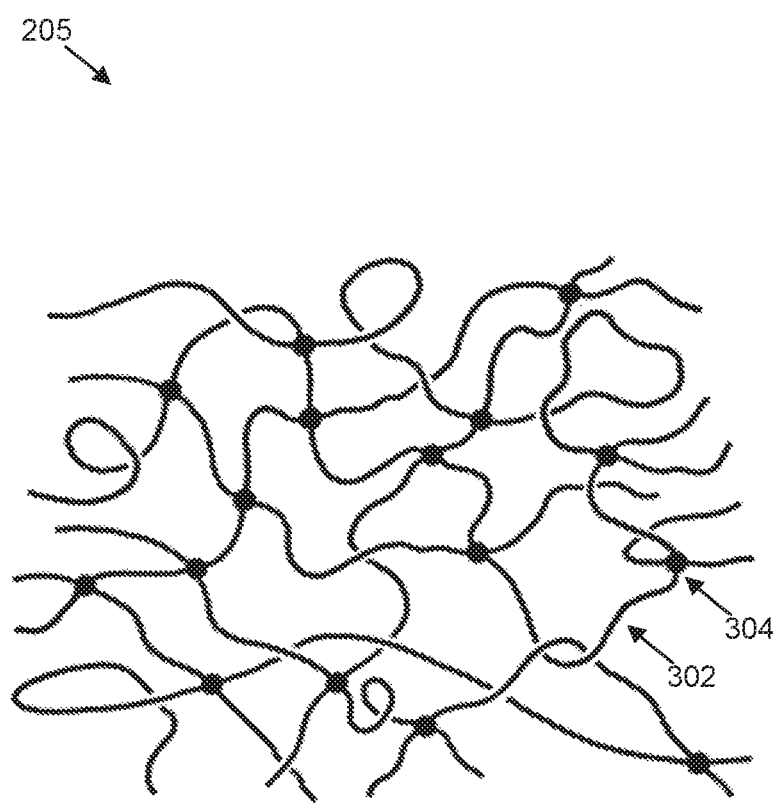
FIG. 3 is a diagram illustrating an embodiment of an adhesive polymer network in accordance with embodiments of the present disclosure.

FIG. 3 is a diagram illustrating an embodiment of an adhesive polymer network in accordance with embodiments of the present disclosure. A lubricious (i.e., diluent) component, or mixture of components, may be utilized to decrease the cross-link density of the adhesive 205, reduce constraints on the movement of polymer chains 302 and network junctions 304 in response to an applied stress, and tailor the adhesive peel strength to a specific substrate.

Mechanically, the impact of adding a lubricious component to the adhesive 205 is to change the extension ratio (direction 1) to $\lambda_1=\alpha(V/V_o)^{1/3}$ where $\alpha$ is the ratio of adhesive volumes without and with the lubricious component. In a similar fashion (directions 2 and 3 are mutually perpendicular and perpendicular to direction 1), $\lambda_2=\lambda_3=\alpha^{-1/2}(V/V_o)^{1/3}$. Although adhesive bonding between materials may occur by three fundamental mechanisms (covalent bonding, mechanical interlocking, and acid-base interaction), the adhesive 205 must first wet the surface of the bonding interface and the lubricious component may be tailored to increase surface wet ability. The phrase "mechanical interlocking" refers to an adhesive that flows into pores in the adhered surface or around projections on the bound surfaces.

Figure 4:
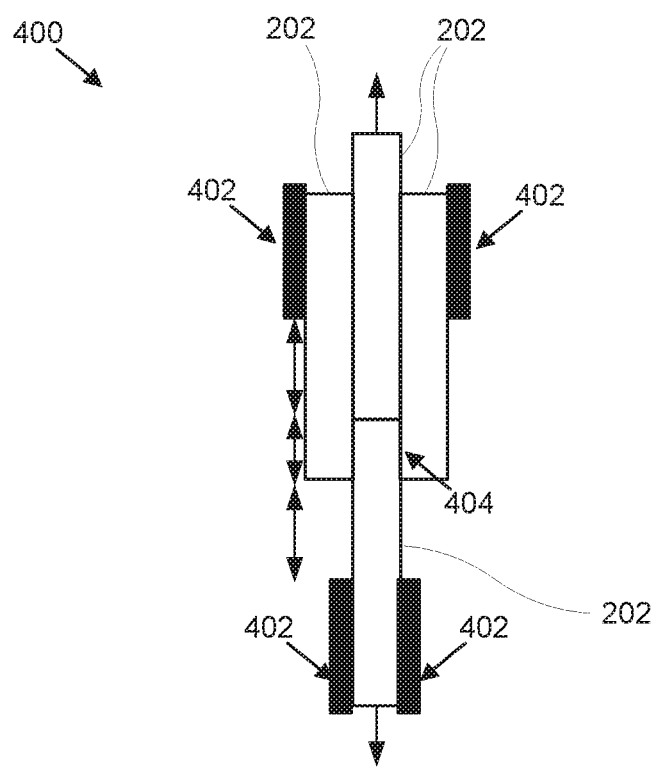
FIG. 4 is a schematic block diagram illustrating one embodiment of a testing device for testing shear modulus, elongation at elastic limit, and shear strength at elastic limit in accordance with embodiments of the present disclosure.

FIG. 4 is a schematic block diagram illustrating one embodiment of a testing device for testing shear modulus,

TABLE 1

| Substrate HC | Film Thickness (mm) | Particulate wt % in HC/ Front | Particulate wt % in HC/ Back | Prime Optical | Avg SiC Haze (%) | MB Avg Dia. (mm) |
|---|---|---|---|---|---|---|
| Acrylate Monomer/PET (0.05 mmt)/ Acrylate Monomer | 0.05 | 0 | 0 | 93.8% T, 0.40% H | 40.9 | <2.7 |
| Acrylate Monomer/PET (0.05 mmt)/ Acrylate Monomer + particulates | 0.05 | 57.8 | 35.3 | 94.2% T, 0.14% H | 2.49 | 3.40 |
| PET (0.05 mmt)/Acrylate Monomer + particulates (both sides) | 0.05 | 58 | 58 | 94.2% T, 0.17% H | 4.38 | 4.30 |
| Acrylate Monomer/PET (0.075 mmt)/ Acrylate Monomer + particulates | 0.075 | 58.5 | 36.9 | 94.0% T, 0.17% H | 3.05 | 4.70 |
| PET (0.075 mmt)/Acrylate Monomer + PM (both sides) | 0.075 | 58.4 | 57.8 | 94.2% T, 0.16% H | 3.43 | 6.70 |
| Acrylate Monomer/PET (0.1 mmt)/Acrylate Monomer + particulates | 0.1 | 58.2 | 0 | 93.7% T, 0.21% H | 4.43 | 10.5 |
| Acrylate Monomer/PC/PMMA (0.25 mmt)/ Acrylate Monomer | 0.25 | 0 | 0 | | 24.06 | 12.4 |
| Acrylate Monomer/PC/PMMA (0.25 mmt)/ Acrylate Monomer + particulates | 0.25 | 45 | 0 | 91.5% T, 0.17% H | 4.27 | 22.3 |

Adhesives, 205, in some embodiments, may be applied to the foldable mobile device display stacks 200 as a film (i.e., sheet) or liquid. For example, a liquid adhesive may be applied to the thin films 202 and/or hard coats 204 using an automated drawdown machine for casting films. In one embodiment, the adhesive 205 is formed of polymeric chains (e.g., acrylate, silicone) that are cross-linked by any suitable method such as, but not limited to, UV, thermal, or chemical cure. The term "polymeric chains" refers to a large molecule, or macromolecule, composed of many repeated subunits (monomers). In a further embodiment, the adhesive 205 is formed with a lubricious component.

Certain adhesive network parameters controlled by the adhesive formulation include: $\varphi$, the number of chains elongation at elastic limit, and shear strength at elastic limit in accordance with embodiments of the present disclosure. Lap-shear testing and dynamic mechanical analysis ("DMA") were used to quantify the viscoelastic behavior of the adhesive 205 materials. Testing of adhesive characteristics was performed and the adhesives 205 were characterized in liquid optically clear adhesive ("LOCA") and tape or film ("T/F") product formats. The adhesives 205 were tested having a thickness of either 50-μm or 100-μm. Displacement was optically measured as a function of normal tensile load. DMA applies a sinusoidal strain to a clamped sample and the stress is measured, allowing determination of the strain-relaxation properties.

Grips 402 attached to surfaces of the thin films 202 were used to apply the lap-shear testing and DMA forces. Adhesives 205 were disposed between the thin films 202 indicated by arrows 404. LOCA adhesives were cast into films with an automated laboratory drawdown machine designed to create accurate, repeatable laboratory samples. The drawdown machine, in one embodiment, uses 12-in wound wire rods and has a maximum sample size of 8.5-in×13-in (21.5 cm×33 cm). Wet coating thickness can be accurately predicted within one tenth of a mil (0.0001-in).

Table 2 gives the characteristics of commercial optically clear, LOCA cast films and T/F adhesives characterized by double lap-shear testing at room temperature with a strain rate of 0.5-mm/min, to yield very low deformation-rate material properties. In general the adhesives in Table 2 have low-modulus and glass transition ("$T_g$") below −50° C. The phrase "glass transition" refers to the temperate where a reversible transition occurs in amorphous materials (or in amorphous regions within semicrystalline materials) from a hard and relatively brittle "glassy" state into a rubber-like state, as the temperature is increased. In Table 2, n represents the index of refraction.

Mobile devices with foldable display stacks 200 experience transitions between folded and open states. To qualify as a suitable adhesive for use in a foldable display stack, the adhesive 205 in the display stack 200 should mechanically relax in response to mechanical shear without mechanical hysteresis at extension ratios characteristic of the application, irrespective of their relationship to the mechanical axis.

Adhesive 205 relaxation was quantified with a hydraulic mechanical testing system with a laser system to measure sample displacement. The adhesive sample was subjected to a quick lap shear displacement to set shear strain of ~100% to 300% at a specified rate of 15- to 200-mm/min(=0.25–3.3-mm/s). The sample was held at one position for set time (10-300 sec) while recording stress and displacement. The sample was cycled from set extension to zero displacement 3 times. The stress relaxation frequency assumes the time to reach the maximum shear strain equals one half of a full cycle, i.e. time to close or time to open; folding frequency range is approximately 0.5 Hz to 2.0 Hz. The relaxation frequency depends on both the extension rate (mm/min) and final displacement. A 10 Hz sampling frequency was used.

TABLE 2

| ID | Type | Chemistry | n | $T_g$ from DSC | Adhesive Thickness | Low Deformation Rate = 0.5 | | |
|---|---|---|---|---|---|---|---|---|
| | | | | | | Shear Modulus | Elongation at Elastic Limit | Shear Strength at Elastic Limit |
| A1 | LOCA | Acrylic | 1.47 | −51 C. | 0.1 mm | 32.5 kPa | 265% | 85 kPa |
| A2 | LOCA | Acrylic | 1.47 | −51 C. | 0.1 mm | 49.8 kPa | 181% | 95 kPa |
| A3 | LOCA | Acrylic | 1.51 | | 0.1 mm | 77.8 kPa | 220% | 166 kPa |
| A4 | LOCA | Silicone | 1.41 | | 0.05 mm | 73 kPa | 275% | 162 kPa |
| B1 | LOCA | Acrylic | 1.52 | −58 C. | 0.1 mm | 40.5 kPa | 250% | 97 kPa |
| B2 | LOCA | Acrylic | 1.52 | −58 C. | 0.05 mm | 24.5 kPa | 315% | 75 kPa |
| B2 | LOCA | Acrylic | 1.52 | −58 C. | 0.1 mm | 36.5 kPa | 105% | 40 kPa |
| B3 | LOCA | Acrylic | 1.48 | | 0.1 mm | 35 kPa | 280% | 100 kPa |
| C1 | T/F | Acrylic | 1.48 | | 0.075 mm | 18.5 kPa | 850% | 170 kPa |
| C2 | T/F | Silicone | 1.41 | | 0.1 mm | 56 kPa | 750% | 451 kPa |
| C3 | T/F | Silicone | 1.41 | | 0.05 mm | 46 kPa | 790% | 390 kPa |
| C4 | T/F | Silicone | 1.41 | | 0.05 mm | 52 kPa | 270% | 145 kPa |
| E1 | T/F | Synthetic Rubber | | | 0.025 mm 0.075 mm | 105 kPa | >450% | >400 kPa |

Figure 5:
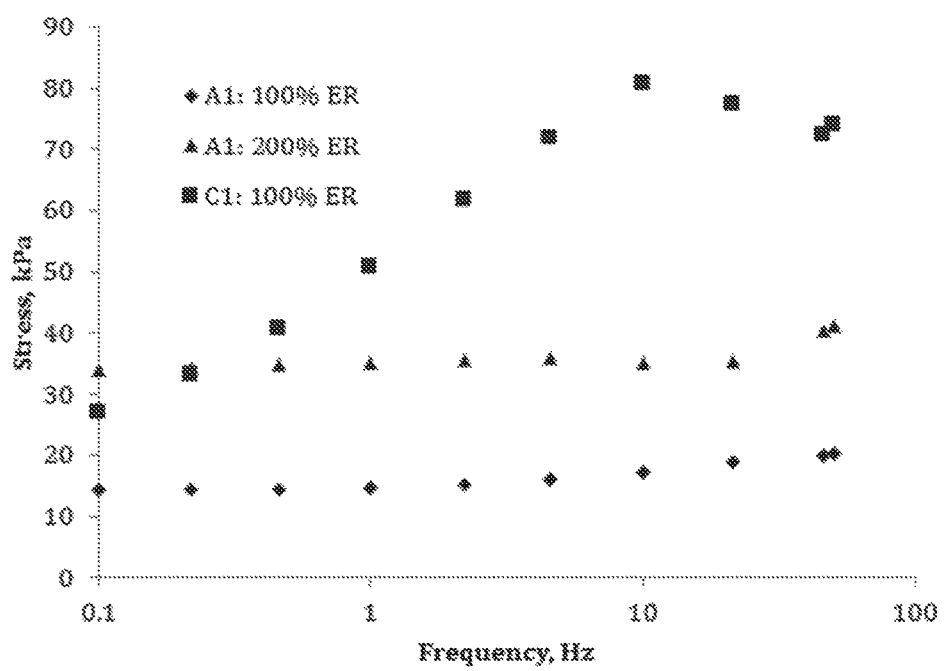
FIGS. 5-8 are graphs illustrating adhesive shear properties of the samples depicted in Table 2 in accordance with embodiments of the present disclosure.
Figure 6:
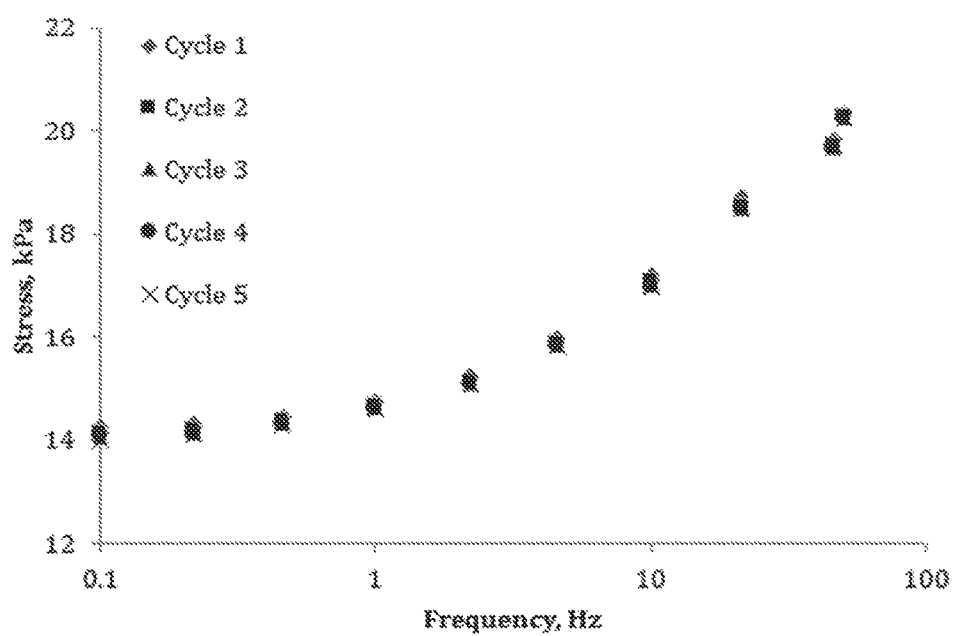

FIGS. 5-8 are graphs illustrating adhesive shear properties of the samples depicted in Table 2 in accordance with embodiments of the present disclosure. A material's shear properties depend on a deformation rate as illustrated in FIGS. 5-8 for acrylate-based and silicone-based adhesives. FIG. 5 illustrates the DMA shear stress as a function of shear frequency for acrylate A1 at 100% and 200% extension ratios (ER) compared with acrylate C1 at 100% ER, FIG. 6 illustrates the results of after 5 cycles of the DMA shear stress as a function of shear frequency for acrylate A1 at 100% ER. Results for the cycles are consistent.

Figure 7:
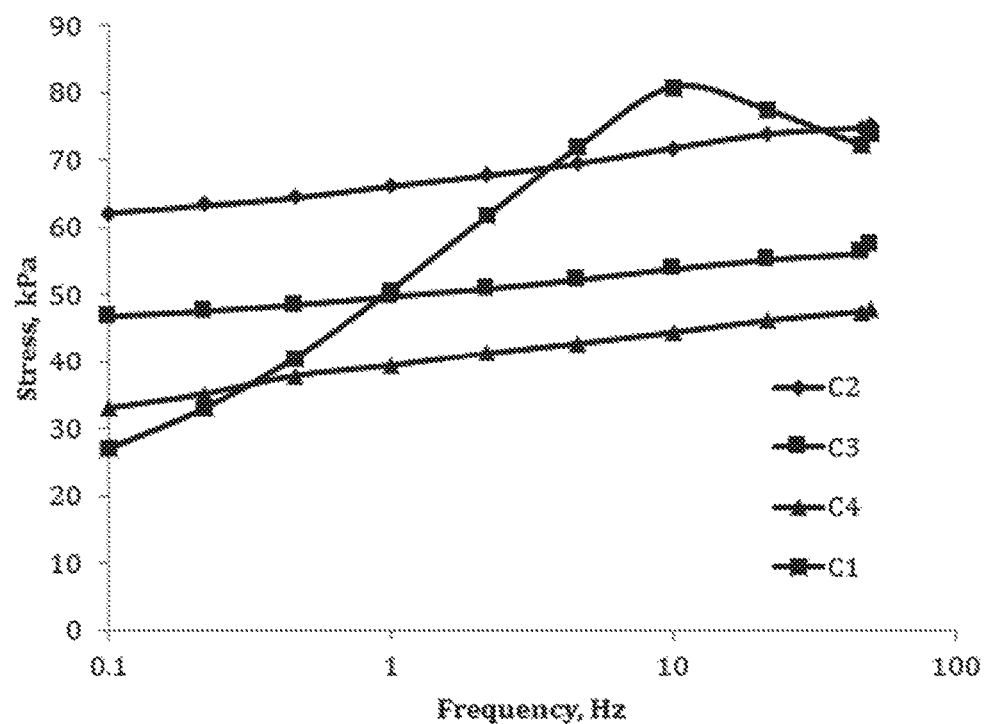
Figure 8:
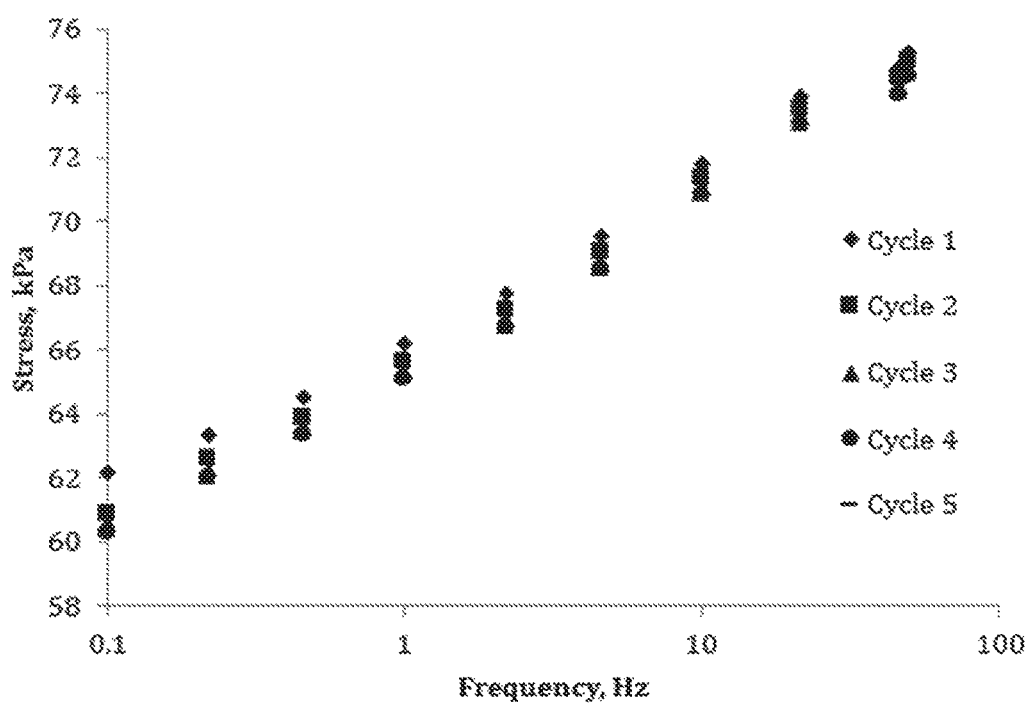

FIG. 7 shows the DMA shear stress as a function of shear frequency for silicones C2, C3, and C4 at 100% ER compared with the acrylate C1 at 100% ER. FIG. 8 shows the results of 5 cycles of the DMA shear stress as a function of shear frequency for silicone C2 at 100% ER. Again, results for the cycles are consistent. The stress-strain properties of acrylate C1 have greater frequency dependence than the silicones, C2-C4.

Figure 9:
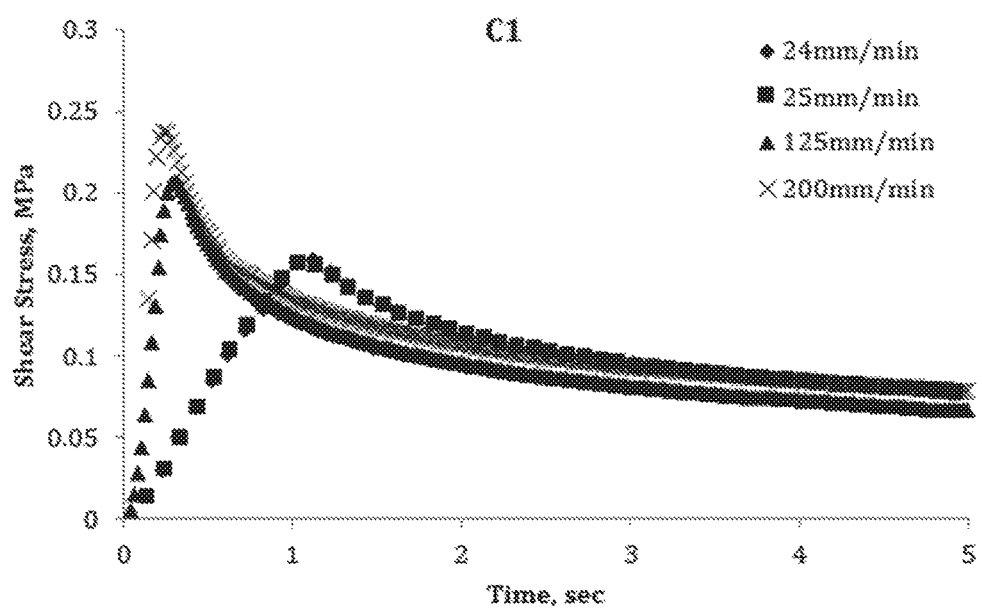
FIGS. 9-11 are graphs illustrating shear stress or shear strain as a function of time for different adhesive samples in accordance with embodiments of the present disclosure.
Figure 10:
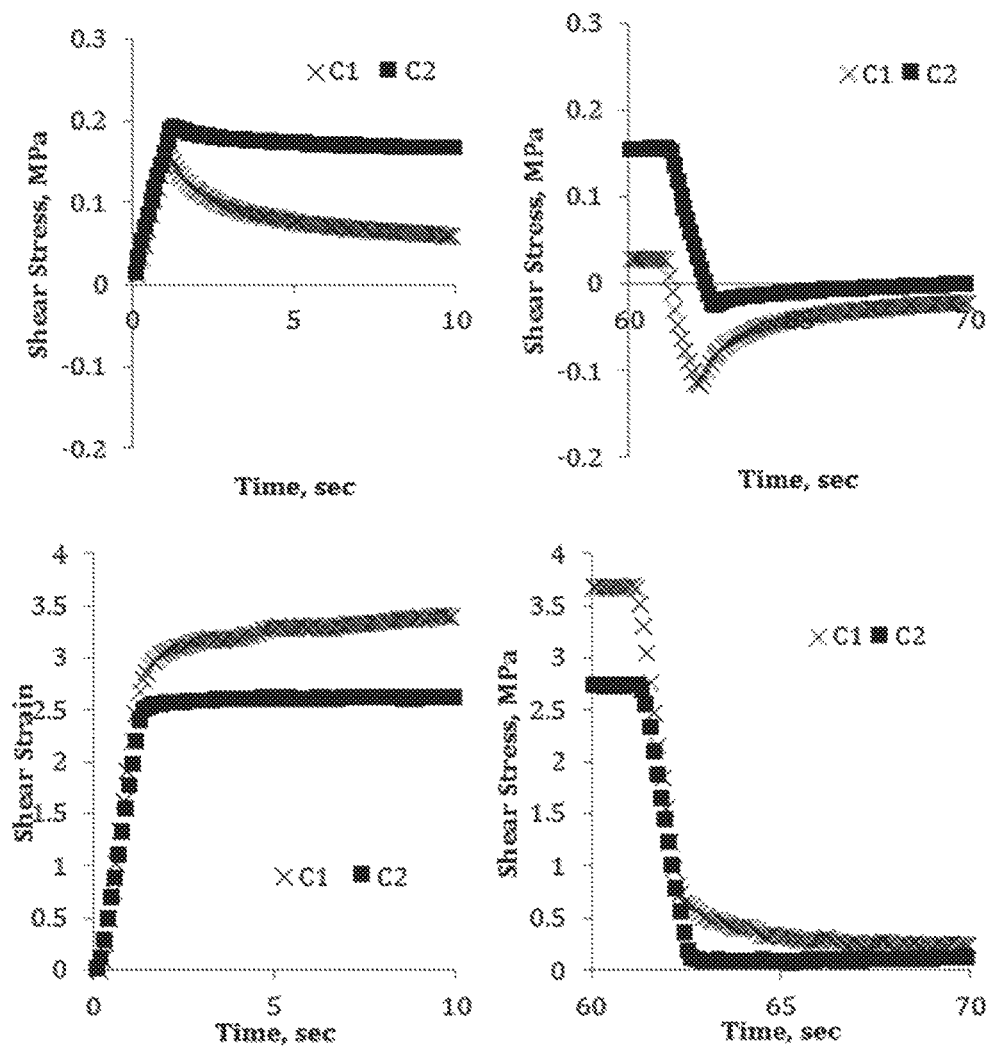
Figure 11:
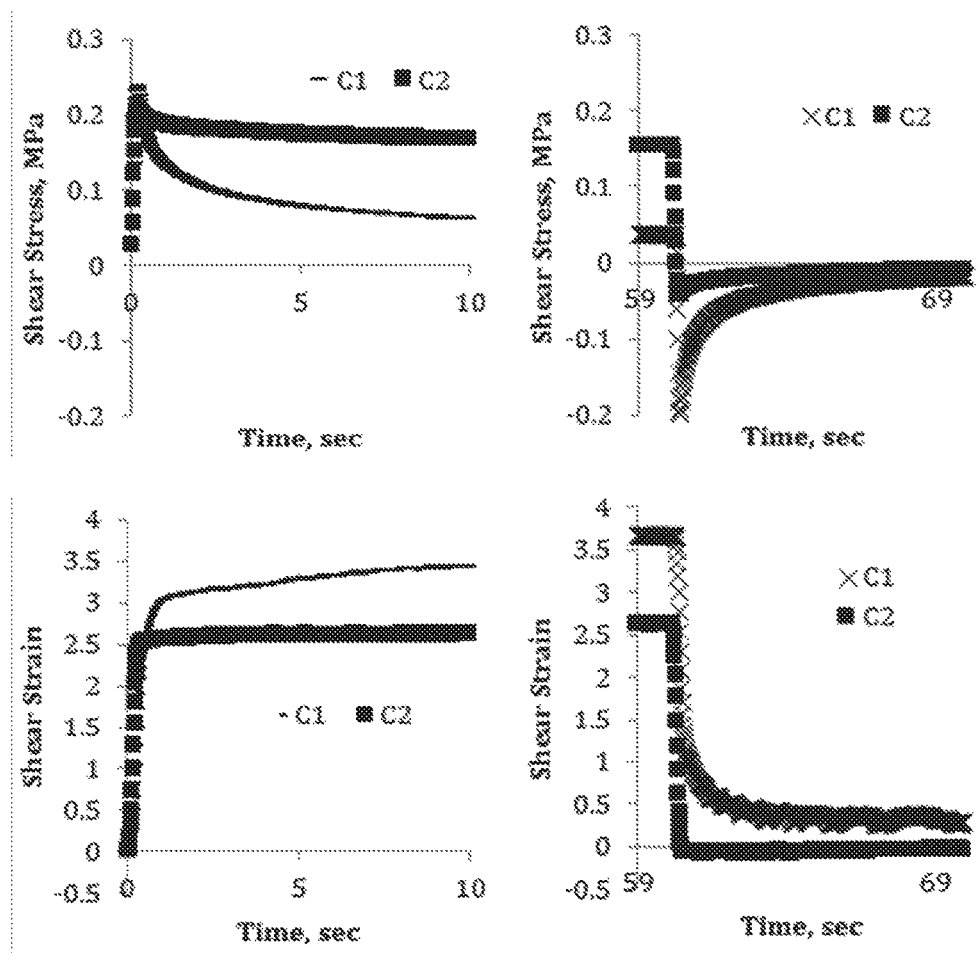

FIGS. 9-11 are graphs illustrating shear stress or shear strain as a function of time for different adhesive samples in accordance with embodiments of the present disclosure. FIG. 9 is a graph illustrating shear stress dependence on extension rate for an adhesive sample in accordance with embodiments of the present disclosure. In particular, C1 (acrylate) during 0.4 mm total shear displacement. Note that folding applications of handheld devices may have a folding frequency range of approximately 0.5 Hz and 2 Hz.

FIGS. 10 and 11 illustrate shear stress and shear strain, as a function of time, for C1 (acrylate) and C2 (silicone) for a shear rate of 25-mm/min and 200-mm/min during 0.4-mm total shear displacement, respectively. In addition, optical defects may occur at interfaces during shear. Table 3 summarizes stress relaxation tests for commercial optically clear, LOCA cast films and T/F adhesives. Low-deformation rate shear moduli generally differ from dynamic-rate shear moduli. In Table 3, ID represents the sample adhesive.

TABLE 3

| ID | Shear Elongation % | Shear Stress kPa | Equivalent Folding Rate Hz | Dynamic Shear Modulus kPa | Low-Deformation Rate Shear kPa | Optical Defects Observed Pass/Fail | Shear Modulus Rate Dependent Y/N | Stress Relaxation Over Time Y/N |
|---|---|---|---|---|---|---|---|---|
| A1 | 160% | 70 | 0.7 | 44 | 32.5 | Pass | Y - 43% | N |
|  | 200% | 97 | 0.5 | 48 |  | Fail |  |  |
| A4 | 110% | 81 | 0.4 | 74 | 96 | Fail | N @ ~1 Hz | N |
| B1 | 160% | 50 | 0.8 | 31 | 40.5 | Pass | N @ ~1 Hz | N |
| B3 | 90% | 56 | 0.9 | 63 | 35 | Fail | N @ ~1 Hz | N |
| C1 | 300% | 238 | 2.1 | 79 | 18.5 | Pass | Y - 200% | Y (>10 seconds) |
| C2 | 250% | 200 | 2.2 | 82 | 56 | Pass | Y - 21% | N |
| C3 | 430% | 278 | 1.9 | 65 | 46 | Pass | Y - 23% | N |
| C4 | 85% | 56 | 0.8 | 66 | 52 | Pass | Y - 45% | N |
|  | 125% | 78 | 0.7 | 62 |  | Fail |  |  |
| E1 | 183% | 222 | 0.54 | 121 | 105 | Pass | N @ ~1 Hz | N |

Plastic laminates test coupons, formed of polyethylene terephthalate ("PET") sheets adhered together were tested in a folding fixture composed of two plates on a rotating fixture, where one plate is fixed and the second cycles between 2° and 178° (approximating the closed to open state in a foldable device) effectively creating a bend radius of approximately 5-mm. The test coupons were made from 0.178-mm thick PET sheet and 0.05-mm thick PET sheet coated with hard coats described above, and adhered together with either 0.05-mm or 0.10-mm thick adhesive. The 0.178-mm thick PET simulates a pOLED display stack (e.g., pOLED, touch, and polarizer). The 0.05-mm thick PET plus hard coat represents a lens or lens liner. The plastic laminates were evaluated subsequent to folding tests for PET delamination, PET deformation, and hard coat cracking, the results of which are shown in Table 4.

Table 4 contains the plastic laminates, comprised of the lowest modulus commercially available adhesives, subjected to 10,000 folding cycles at 2 Hz folding frequency. Laminates are identified by the sample number and each measurement was repeated twice (1 and 2). Sample 1 is the 0.178-mm thick PET which demonstrates no delamination, deformation, of hardcoat cracks—as expected. Samples 2, 3, 5-9, and 11 are 3 layer laminates (two polymer and 1 adhesive)—only sample 11, which contains the lowest modulus adhesive, does not demonstrate delamination, deformation, hardcoat cracking, or a combination of these. Samples 4, 10, and 12 are 5-layer laminates (3 polymer and 2 adhesive) which demonstrate delamination, deformation, hardcoat cracking, or a combination of these. A critical assessment reveals adhesive A1, the lowest modulus adhesive, transfers less stress in a 3-layer laminate (sample 11) demonstrating no failures; however adhesive A1 fails in 5-layer laminates.

TABLE 4

| Sample No. | Laminate Stack Samples 1-6: 15 mm × 50 mm Samples 7-12: 25 mm × 75 mm | | | | | Adhsv Dyn Shear Mod | Delam 10K | | Deformed 10K | | Hard-coat crack 10K | |
|---|---|---|---|---|---|---|---|---|---|---|---|---|
|  | Layer 1 | Layer 2 | Layer 3 | Layer 4 | Layer 5 |  | 1 | 2 | 1 | 2 | 1 | 2 |
| 1 | 178 um PET |  |  |  |  | N/A | N | N | OK | OK | N/A | N/A |
| 2 | 178 um PET | 100 um C2 | 50 um PET + HC |  |  | 82 kPa | Y | N | High | High | Y | Y |
| 3 | 178 um PET | 50 um C2 | 50 um PET + HC |  |  | 82 kPa | N | N | High | High | Y | Y |
| 4 | 178 um PET | 50 um C2 | 50 um PET + HC | 100 um C2 | 50 um PET + HC | 82 kPa | N | N | High | High | Y | Y |
| 5 | 178 um PET | 50 um C2 | 50 um PET |  |  | 82 kPa | N | N | Low | Low | N/A | N/A |
| 6 | 178 um PET | 50 um C4 | 50 um PET + HC |  |  | 52 kPa | Y | Y | High | High | N | N |
| 7 | 178 um PET | 100 um A4 | 50 um PET |  |  | 74 kPa | N | N | Low | Low | N/A | N/A |
| 8 | 178 um PET | 100 um A4 | 50 um PET + HC |  |  | 74 kPa | N | N | High | High | Y | Y |
| 9 | 178 um PET | 50 um A4 | 50 um PET + HC |  |  | 74 kPa | N | N | High | High | Y | Y |
| 10 | 178 um PET | 50 um A4 | 50 um PET + HC | 100 um A4 | 50 um PET + HC | 74 kPa | N | Y | High | High | Y | Y |

TABLE 4-continued

| Sample No. | Laminate Stack Samples 1-6: 15 mm × 50 mm Samples 7-12: 25 mm × 75 mm | | | | | Adhsv Dyn Shear Mod | Delam 10K | | Deformed 10K | | Hard-coat crack 10K | |
|---|---|---|---|---|---|---|---|---|---|---|---|---|
| | Layer 1 | Layer 2 | Layer 3 | Layer 4 | Layer 5 | | 1 | 2 | 1 | 2 | 1 | 2 |
| 11 | 178 um PET | 100 um A1 | 50 um PET + HC | | | 44 kPa | N | N | N | N | N | N |
| 12 | 178 um PET | 100 um A1 | 50 um PET + HC | 100 um A1 | 50 um PET + HC | 44 kPa | N | N | N | Low | N | N |

Figure 12:
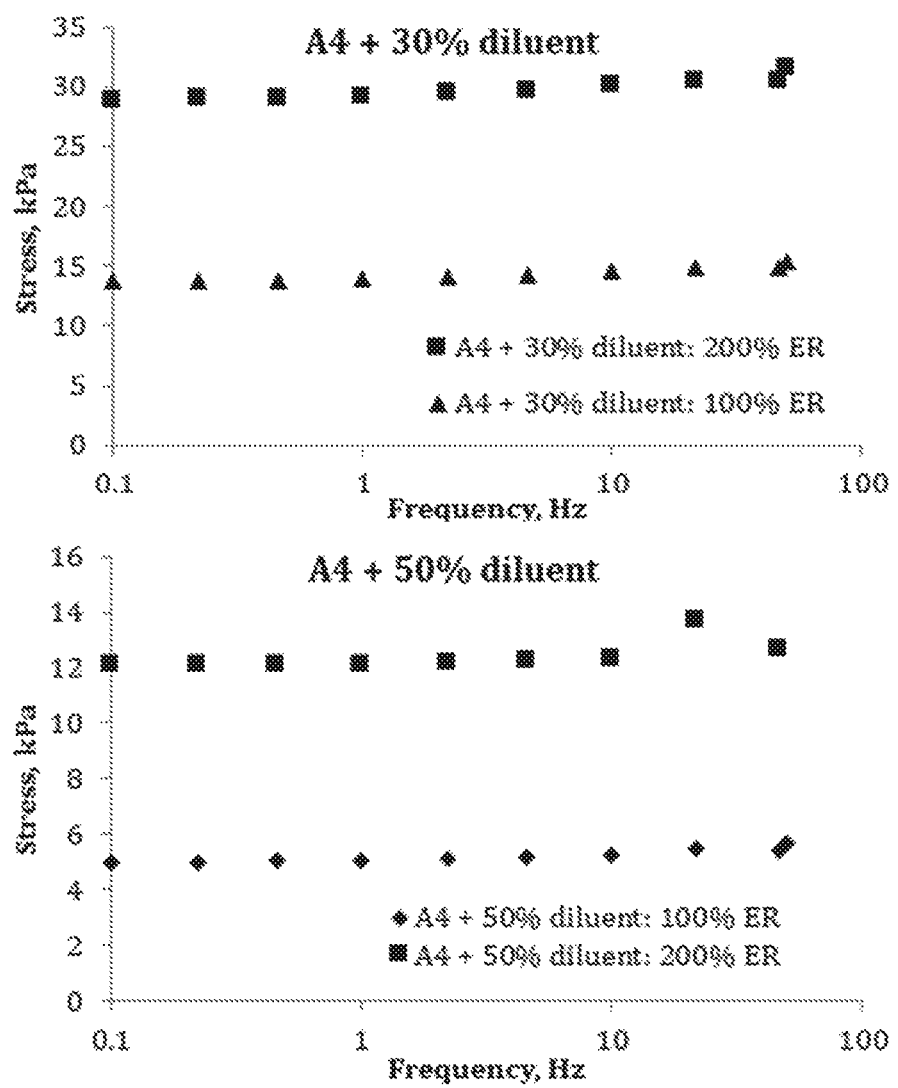
FIGS. 12-15 are graphs illustrating shear properties for acrylate-based and silicon-based samples and their relation to deformation rate and diluent content in accordance with embodiments of the present disclosure.
Figure 13:
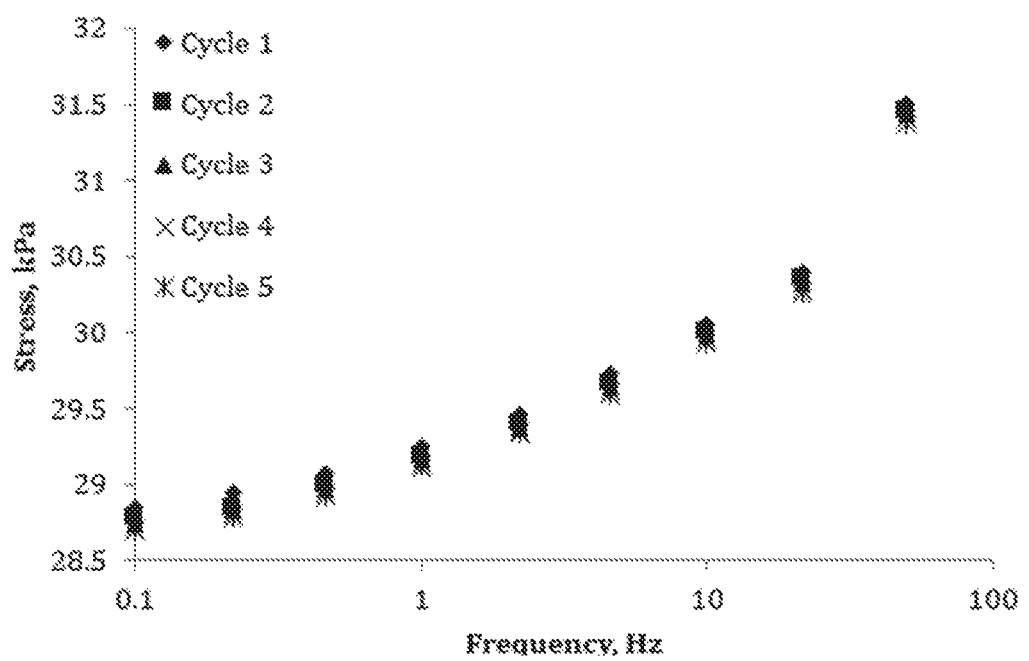

FIGS. 12-15 are graphs illustrating shear properties for acrylate-based (samples A1, A7-A10) and silicon-based (samples A4 and A4+D) samples and their relation to deformation rate and diluent content in accordance with embodiments of the present disclosure. FIG. 12 shows DMA shear stress as a function of shear frequency for sample A4+30 vol % diluent (top) and A4+30 vol % diluent (bottom) (silicone) at 100% and 200% extension ratio (ER). FIG. 13 shows the results of 5 cycles of the DMA shear stress as a function of shear frequency for A4+50 vol % diluent at 200% ER—results for the cycles are very consistent.

Figure 14:
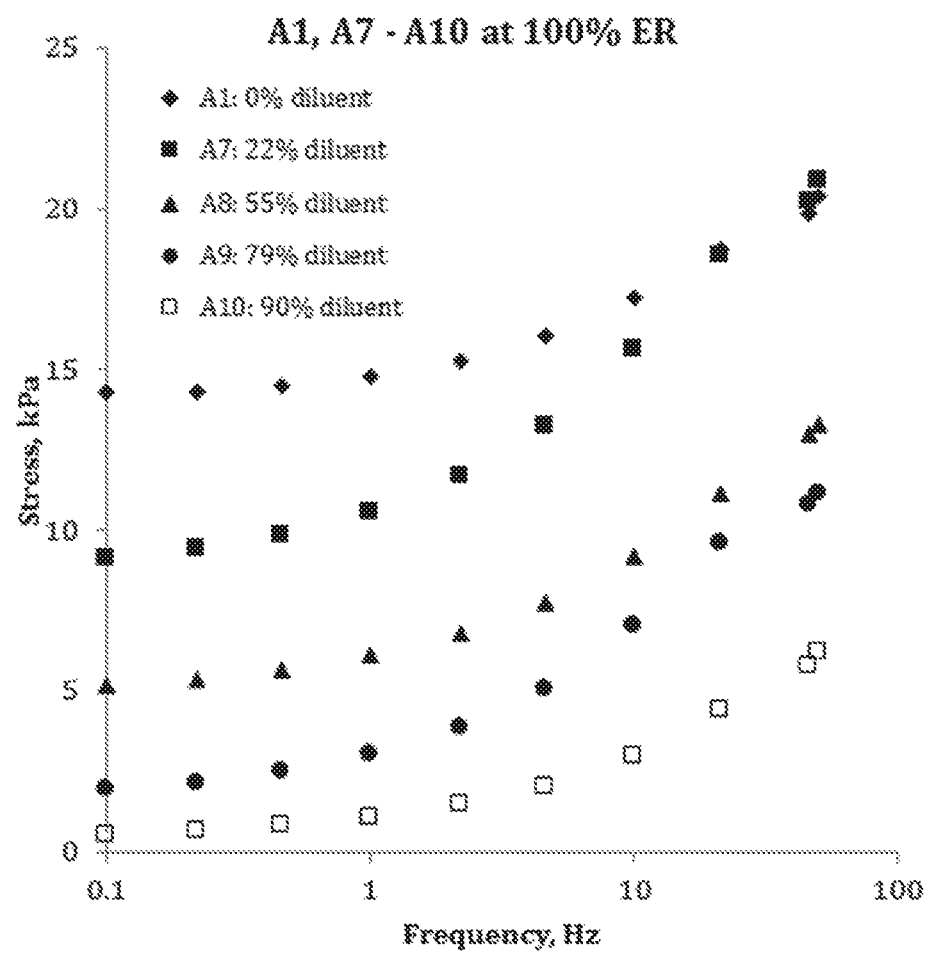
Figure 15:
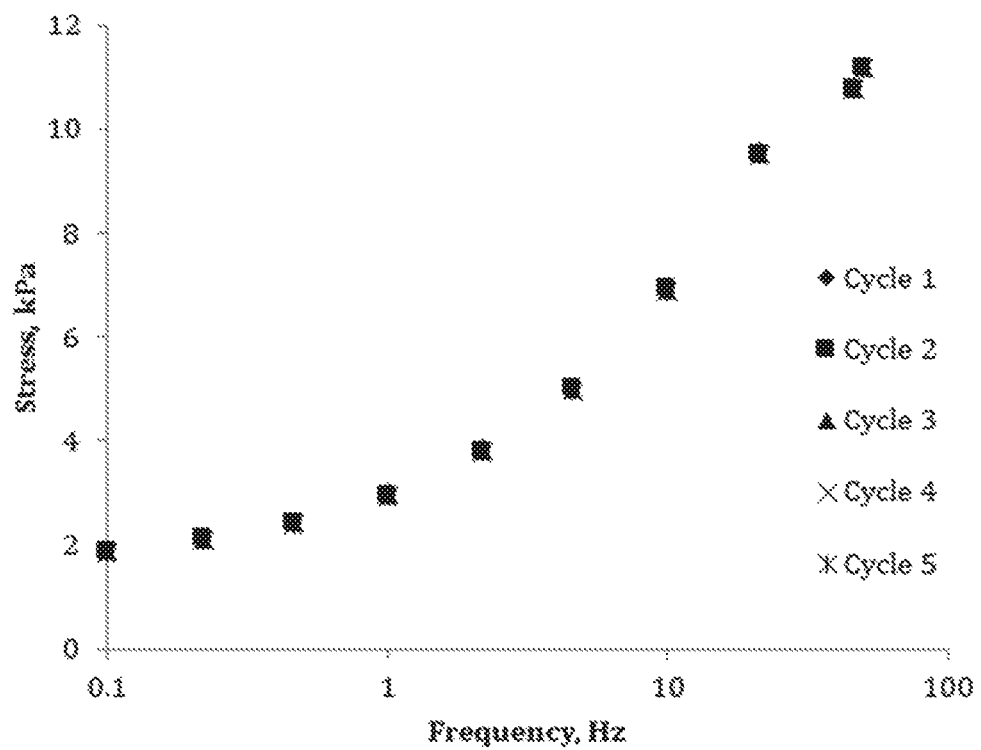

FIG. 14 illustrates DMA shear stress as a function of shear frequency for samples A1, A7-A10 (acrylate) at 100% extension ratio (ER). FIG. 15 shows the results of 5 cycles of DMA shear stress as a function of shear frequency for A9 at 100% ER—results for the cycles are very consistent. Adhesive relaxation was quantified by subjecting the samples to a quick lap shear displacement to set shear strain of ~100% to 200% at a specified rate of 15- to 45-mm/min (=0.25–0.75-mm/s). The sample was held at one position for set time (10-300 sec) while recording stress and displacement. The sample was cycled from set extension to zero displacement 3 times. The stress relaxation frequency assumes the time to reach the maximum shear strain equals one half of a full cycle, i.e. time to close or time to open; folding frequency range is approximately 0.5 Hz to 2.0 Hz. The relaxation frequency depends on both the extension rate (mm/min) and final displacement. A 10 Hz sampling frequency was used.

Some of the adhesives in the present disclosure, beneficially decrease stress transfer between layers in a display stack 200 to prevent delamination and buckling of constituent layers due to tensile and compressive forces present in the laminated film stack during bending. This is illustrated in Table 5, which presents double lap-shear data taken at room temperature at a strain rate of 0.5-mm/min and compares the characteristics of optically clear, acrylate and silicone LOCA cast films and T/F adhesives and the same adhesive formulated with additives, or diluents, to reduce the cross-link density and reduce/eliminate the molecular constraints to polymer chain and cross-link movement in response to an applied stress (formulated adhesives designated by dark sample IDs). A1 is the polymer used in formulates A7-A10. Diluents used are, for example, a (diphenyl-dimethylsiloxane copolymer), b (butyl-terminated polydimethylsiloxane), and c (alkane+pendant alkyl groups on acrylate). Low deformation rate shear moduli decrease in adhesive formulations containing increasing amounts of additives, or diluents, because they have lower cross-link densities compared with adhesives without additives. In the acrylic adhesives (A1, A7-A10) interactions between the diluent and the elastic component of the adhesive are observed (see Table 6), and present evidence that, and methodologies to tailor the $T_g$ and peel strength of an adhesive formulation by judicious choice of lubricious component to achieve desired properties based on specific application requirements.

TABLE 5

| | | | | | | | Low Deformation Rate = 0.5 mm/min | | |
|---|---|---|---|---|---|---|---|---|---|
| ID | Type | Chemistry | n | $T_g$ from DSC | Adhsv Thcknss | Diluent | Diluent Vol % | Shear Mod | Elongation at Elastic Limit | Shear Strength at Elastic Limit |
| A2 | LOCA | Acrylic | 1.47 | −51 C. | 0.1 mm | — | 0% | 49.8 kPa | 181% | 95.2 kPa |
| A2 + D | LOCA | Acrylic | 1.47 | −51 C. | 0.1 mm | a | 10% | 33 kPa | 310% | 98 kPa |
| A4 | LOCA | Silicone | 1.41 | | 0.1 mm | — | 0% | 96 kPa | 100% | 90 kPa |
| A4 + D | LOCA | Silicone | 1.41 | | 0.1 mm | b | 20% | 73 kPa | 160% | 75 kPa |
| A4 + D | LOCA | Silicone | 1.41 | | 0.1 mm | b | 30% | 33 kPa | 110% | 36 kPa |
| A4 + D | LOCA | Silicone | 1.41 | | 0.1 mm | b | 50% | 18 kPa | 215% | 34 kPa |
| A1 | LOCA | Acrylic | 1.47 | −51 C. | 0.1 mm | — | 0% | 32.5 kPa | 265% | 81.2 kPa |
| A7 | T/F | Acrylic | 1.47 | | 0.07 mm | c | 22% | 8.9 kPa | 350% | 30 kPa |
| A8 | T/F | Acrylic | 1.47 | | 0.045 mm | c | 55% | 8.5 kPa | 430% | 35 kPa |
| A9 | T/F | Acrylic | 1.47 | | 0.1 mm | c | 79% | 2.6 kPa | 880% | 41 kPa |
| A10 | T/F | Acrylic | 1.47 | | 0.04 mm | c | 90% | 0.7 kPa | 1030% | 11 kPa |
| B1 | LOCA | Acrylic | 1.52 | −58 C. | 0.1 mm | — | 0% | 40.5 kPa | 250% | 97 kPa |
| B1 + D | LOCA | Acrylic | 1.52 | −58 C. | 0.1 mm | a | 20% | 22.5 kPa | 225% | 47.5 kPa |
| B2 | LOCA | Acrylic | 1.52 | −58 C. | 0.05 mm | — | 0% | 24.5 kPa | 315% | 75 kPa |
| B2 | LOCA | Acrylic | 1.52 | −58 C. | 0.1 mm | — | 0% | 36.5 kPa | 105% | 40 kPa |
| B2 + D | LOCA | Acrylic | 1.52 | −58 C. | 0.1 mm | a | 10% | 31 kPa | 165% | 52 kPa |
| B3 | LOCA | Acrylic | 1.48 | | 0.1 mm | — | 0% | 35 kPa | 280% | 100 kPa |
| B3 + D | LOCA | Acrylic | 1.48 | | 0.1 mm | a | 20% | 22 kPa | 250% | 55 kPa |

Figure 16:
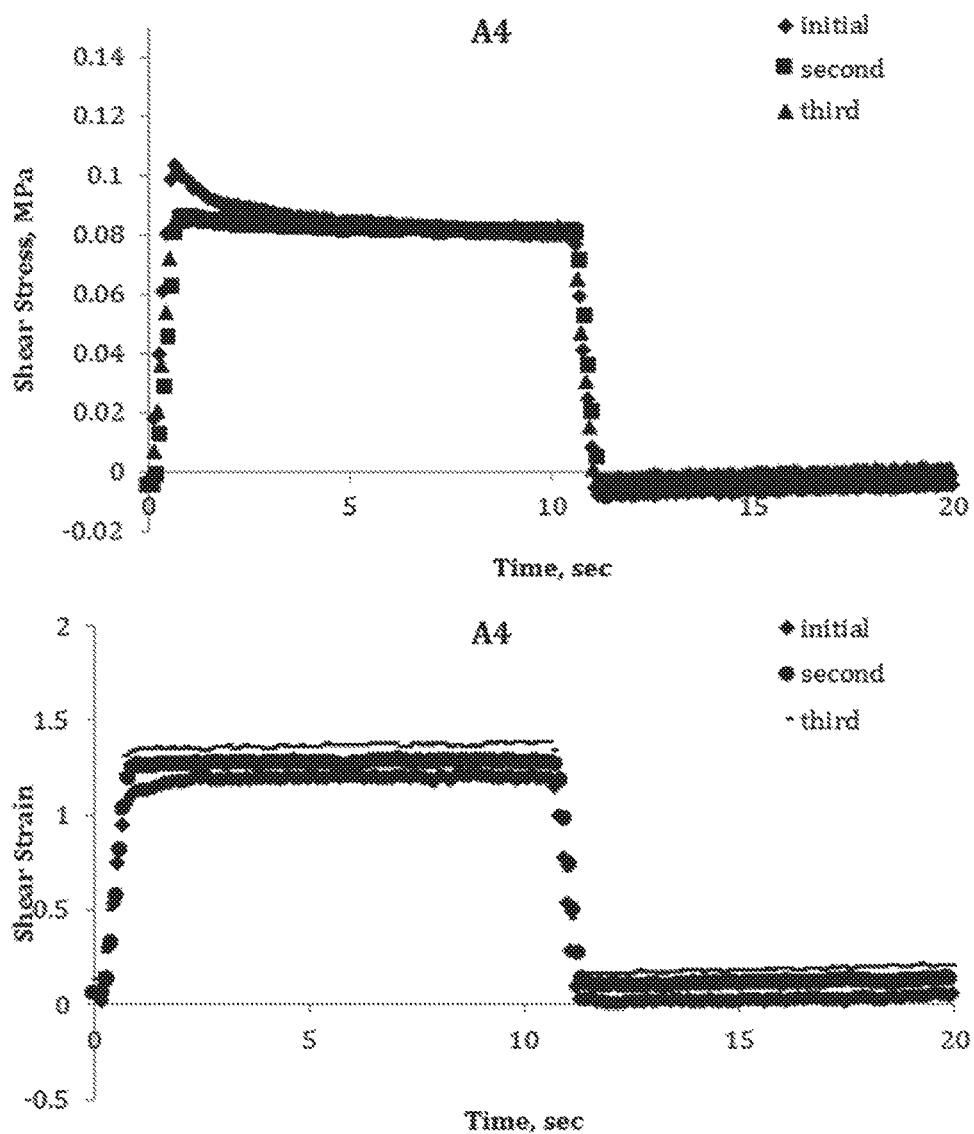
FIGS. 16 and 17 illustrate shear stress (top) and shear strain (bottom), as a function of time for different adhesive samples in accordance with embodiments of the present disclosure.
Figure 17:
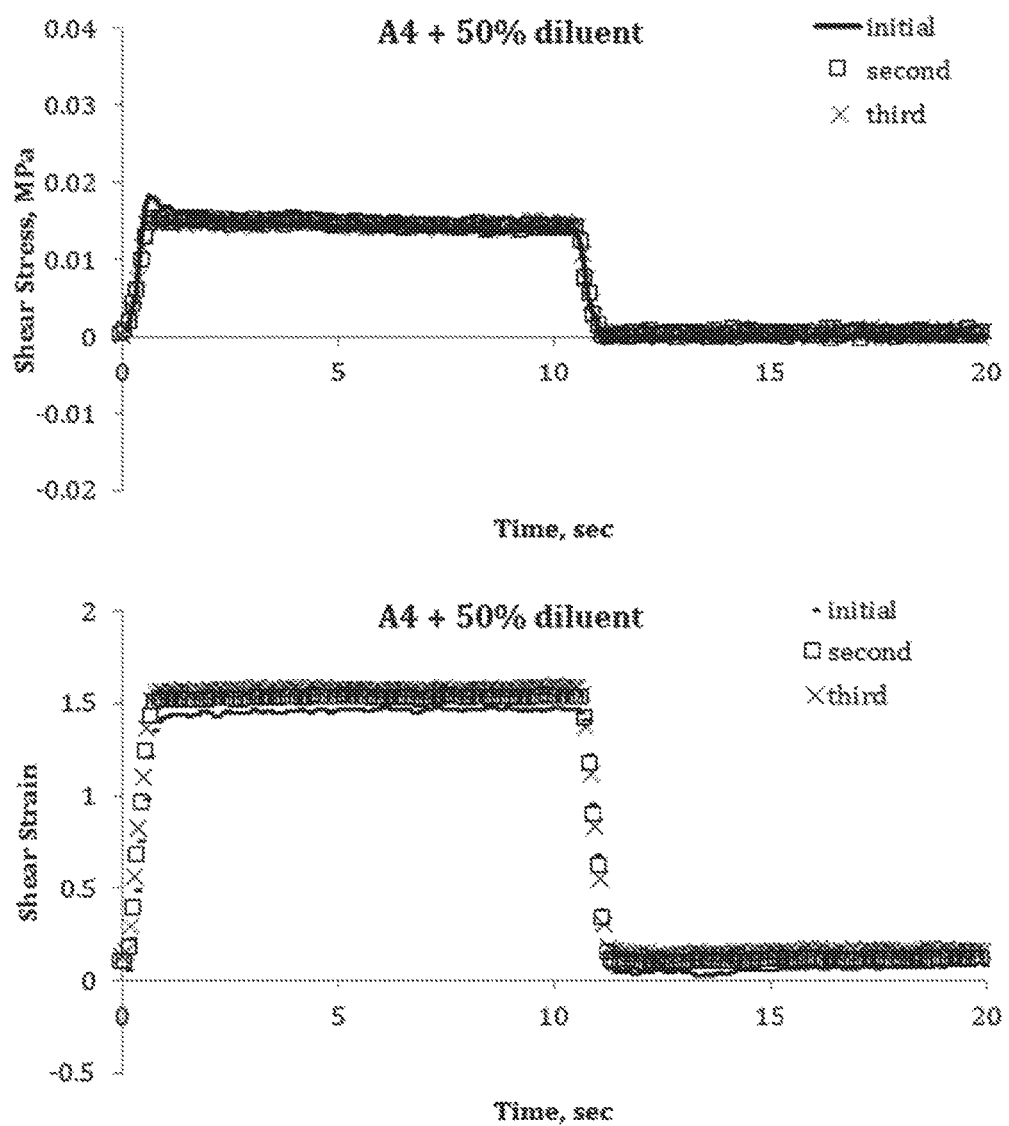

FIGS. 16 and 17 illustrate shear stress (top) and shear strain (bottom), as a function of time for different adhesive samples in accordance with embodiments of the present disclosure. In particular, FIG. 16 illustrates shear stress and shear strain for A4 (silicone) for a shear rate of 21.8-mm/min during 0.182-mm total shear displacement. FIG. 17 illustrates shear stress (top) and shear strain (bottom), as a function of time, for A4 (silicone)+50-vol % diluent (butyl-terminated polydimethylsiloxane) for a shear rate of 19-mm/min during 0.158-mm total shear displacement.

Table 6 (broken in to 6a and 6b) summarizes dynamic and static mechanical properties measured by rotational DMA (taken at 10-radians/sec with a 0.1% shear rate), peel test (taken at a strain rate of 60-mm/min/in), and low- and high-deformation rate lap-shear for optically clear LOCA cast films and T/F adhesives and the same adhesives formulated with additives, or diluents. Optical defects may occur at bonding interfaces during shear as indicated—thus the need to tailor peel strength. The shear modulus is dependent on deformation rate and the variation is given as a percent difference between 0.1 Hz and 50 Hz. Several adhesives experience plastic stress relaxation over the frequency significant to folding applications (0.5 Hz to 2 Hz).

TABLE 6a

| | High Deformation Rate | | | | | | Low Deformation Rate = 0.5 mm/min | | |
|---|---|---|---|---|---|---|---|---|---|
| ID | Shear Elongation | Shear Stress | Equivalent Folding Rate | Dynamic Shear Modulus | Adhsv Thickness | Diluent | Diluent Vol % | Shear Mod | Elongation at Elastic Limit | Shear Strength at Elastic Limit |
| A4 | 115% | 103 kPa | 0.79 Hz | 90 kPa | 0.1 mm | — | 0% | 96 kPa | 100% | 90 kPa |
| A4 + D | 140% | 80 kPa | 0.8 Hz | 57 kPa | 0.1 mm | b | 20% | 73 kPa | 160% | 75 kPa |
| A4 + D | 145% | 18 kPa | 0.8 Hz | 13 kPa | 0.1 mm | b | 50% | 18 kPa | 215% | 34 kPa |
| A1 | 200% | 97 kPa | 0.5 Hz | 48 kPa | 0.1 mm | — | 0% | 32.5 kPa | 265% | 81.2 kPa |
| A7 | | | | | 0.07 mm | c | 22% | 8.9 kPa | 350% | 30 kPa |
| A8 | | | | | 0.045 mm | c | 55% | 8.5 kPa | 430% | 35 kPa |
| A9 | | | | | 0.1 mm | c | 79% | 2.6 kPa | 880% | 41 kPa |
| A10 | | | | | 0.04 mm | c | 90% | 0.7 kPa | 1030% | 11 kPa |

TABLE 6b

| | Dynamic Data from Rotational DMA | | | | Shear | |
|---|---|---|---|---|---|---|
| ID | $T_g$ from DMA | DMA Storage Modulus | Peel Strength 60 mm/min/in | Optical Defects Observed | Modulus Rate Dependent | Stress Relaxation Over Time |
| A4 | | | | Fail | N @ ~1 Hz | N |
| A4 + D | | | | Fail | Y - 12% | N |
| A4 + D | | | | Pass | Y - 13% | Y |
| A1 | −12 C. | 20.0 kPa | 0.79 N/cm | Fail | Y - 43% | N |
| A7 | −45 C. | 15.6 kPa | 0.22 N/cm | Fail @ >200% ER | Y - 128% | Y |
| A8 | −50 C. | 9.0 kPa | 0.10 N/cm | Fail @ >200% ER | Y - 157% | Y |
| A9 | −18 C. | 4.2 kPa | 1.04 N/cm | Fail @ >200% ER | Y - 480% | N |
| A10 | −25 C. | 2.0 kPa | 0.34 N/cm | Pass | Y - 1053% | N |

Plastic laminate test coupons, comprised or polyethylene terephthalate (PET) sheets adhered together were tested in a folding fixture using the methodology described above. The plastic laminates were evaluated subsequent the folding tests for PET delamination, PET deformation, and hard coat cracking (Table 7). Table 7 (broken into Tables 7a and 7b) contains plastic laminates fabricated from the adhesives in Table 6 which were subjected to 10,000 folding cycles at 2 Hz folding frequency.

TABLE 7a

| Sample No. | Test Coupon Size 25 mm × 75 mm | | | | | Diluent Vol % | Adhesive Dynamic Shear Modulus |
|---|---|---|---|---|---|---|---|
| | Layer 1 | Layer 2 | Layer 3 | Layer 4 | Layer 5 | | |
| 13 | 178 um PET | 100 um A1 | 50 um PET + HC | | | 0% | 20.0 kPa |
| 14 | 178 um PET | 100 um A1 | 50 um PET + HC | 100 um A1 | 50 um PET + HC | 0% | 20.0 kPa |
| 15 | 178 um PET | 70 um A7 | 50 um PET + HC | | | 22% | 15.6 kPa |
| 16 | 178 um PET | 45 um A8 | 50 um PET + HC | | | 55% | 9.0 kPa |
| 17 | 178 um PET | 100 um A9 | 50 um PET + HC | | | 79% | 4.2 kPa |
| 18 | 178 um PET | 40 um A10 | 50 um PET + HC | | | 90% | 2.0 kPa |
| 19 | 178 um PET | 50 um A4 | 50 um PET + HC | | | 0% | 90 kPa |

TABLE 7a-continued

| Sample | Test Coupon Size 25 mm × 75 mm | | | | | Diluent | Adhesive Dynamic Shear |
|---|---|---|---|---|---|---|---|
| No. | Layer 1 | Layer 2 | Layer 3 | Layer 4 | Layer 5 | Vol % | Modulus |
| 20 | 178 um PET | 50 um A4 | 50 um PET + HC | 100 um A4 | 50 um PET + HC | 0% | 90 kPa |
| 21 | 178 um PET | 100 um A4 + D | 50 um PET + HC | | | 20% | 57 kPa |
| 22 | 178 um PET | 100 um A4 + D | 50 um PET + HC | | | 50% | 13 kPa |

TABLE 7b

| Sample No. | Low-Deformation Rate Shear Modulus | Delam 10K | | Deformed 10K | | Hard Coat Crack 10K | |
|---|---|---|---|---|---|---|---|
| | | 1 | 2 | 1 | 2 | 1 | 2 |
| 13 | 32.5 kPa | N | N | N | N | N | N |
| 14 | 32.5 kPa | N | N | N | Low | N | N |
| 15 | 8.9 kPa | N | N | Low | Low | N | N |
| 16 | 8.5 kPa | N | N | Low | N | N | N |
| 17 | 2.6 kPa | N | N | N | N | N | N |
| 18 | 0.7 kPa | N | N | N | N | N | N |
| 19 | 96 kPa | N | N | High | High | Y | Y |
| 20 | 96 kPa | N | Y | High | High | Y | Y |
| 21 | 73 kPa | N | N | Low | Low | N | N |
| 22 | 18 kPa | N | N | Low | N | N | N |

Laminates are identified by the sample number and each measurement was repeated twice (1 and 2). Samples 13 and 14 are 3- and 5-layer laminates, respectively, of 0.178-mm thick PET adhered to 50-um PET+HC with adhesive A1. PET plastic deformation is present in 5-layer stacks as a result of stress transfer between the layers during folding. Samples 15-18 are made with A1 and increasing amounts of additives, or diluents (A7-A10), have lower moduli and a decreasing amount of PET plastic deformation—A9 and A10 have no evidence of PET plastic deformation, but adhesive A10 demonstrates low peel strength. Similar results are observed with increasing amounts of additives, or diluents, added to A4 (samples 19-22). Acrylic-based adhesives may be formulated to prevent stress transfer between display stack layers by incorporating additives, or diluents, to reduce the low-deformation shear modulus and dynamic shear modulus below approximately 8.5-kPa and 9.0-kPa, respectively. Silicone-based adhesives may be formulated to prevent stress transfer between display stack layers by incorporating additives, or diluents, to reduce the low-deformation shear modulus and dynamic shear modulus below approximately 18.0-kPa and 13-kPa, respectively. The lowest moduli adhesives do not demonstrate delamination, PET deformation, hard coat cracking, or a combination of these through 10,000 folding cycles.

Adhesive A9 in combination with A1 demonstrates an attractive mixture of properties including high peel strength, low static and dynamic shear moduli to reduce stress transfer between layers in a display stack, and prevent plastic stress relaxation. A 7-layer stack, approximately 4-in ×6-in, was fabricated with the following layer structure: 0.04-mm SS, 0.1-mm A9, 0.179-mm PET, 0.1-mm A9, 0.05-mm PET+ HC, 0.1-mm A1, and 0.05-mm PET+HC. The stack was subjected to 10,000 folding cycles using a 5-mm bend radius without demonstrating delamination, PET deformation, hard coat cracking, or a combination of these through 10,000 folding cycles.

This is a surprising result that goes against the conventional wisdom that focuses on thin, high modulus adhesive materials such as E1 in Table 2, which transfer mechanical stress between bonded layers causing delamination and buckling of bonded stack layers. All adhesives with a dynamic shear modulus above approximately 50 kPa demonstrate delamination, deformation, hardcoat cracking, or a combination of these at ~1 Hz bending frequency at room temperature.

Additionally, the adhesives may be formulated with additives, or diluent, to control the refractive index of the adhesive layers in a display stack which may result in unique optical effects.

Figure 18:
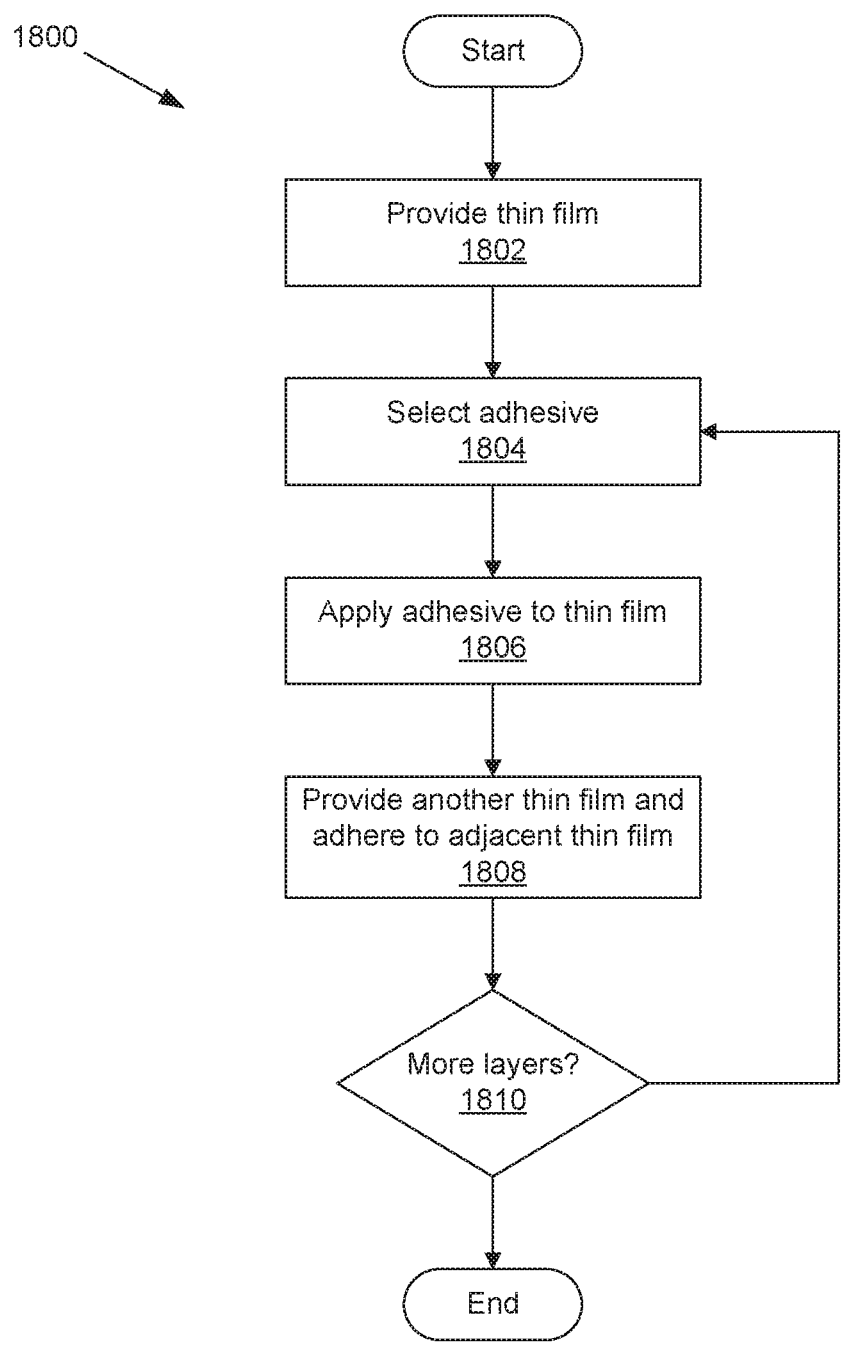
FIG. 18 is a schematic flowchart diagram illustrating one embodiment of a method for assembling a display stack in accordance with embodiments of the present disclosure.

FIG. 18 is a schematic flowchart diagram illustrating one embodiment of a method 1800 for assembling a display stack in accordance with embodiments of the present disclosure. The method 1800 starts and a first thin film is provided 1802. The first thin film is provided as described above with reference to FIG. 2. In one embodiment, the first thin film 1802 is an optically clear polymeric material. For example, the first thin film may be one of the following: polyethylene terephthalate (PET), cyclic olefin polymer (COP), cyclic olefin copolymer (COC), polycarbonate (PC), -colorless polyimide (CPI), transparent polyamide, and poly (methyl methacrylate) (PMMA).

At step 1804 an adhesive is selected according to the embodiments of the present disclosure. The adhesive is selected according to the desired properties, including but not limited to, an adhesive that allows for the mechanical isolation of adjacent layers, allows thin films to absorb energy from impacts, allows for tight radius bending without buckling, etc. In one embodiment, an adhesive is selected with a low shear modulus. For example, an adhesive is selected having a shear modulus of less than 10 kPa. In a further embodiment, the adhesive has a shear modulus of less than 3 kPa.

At step 1806 the adhesive is applied to the thin film. In one embodiment, applying the adhesive to the thin film includes applying a liquid adhesive to the thin film using an automated drawdown machine to achieve a consistent thickness adhesive. In an alternative embodiment, the adhesive is processed to form cross-linking by any suitable method including, but not limited to, UV, thermal, or chemical curing.

At step 1808, another thin film is adhered to the first thin film so that the adhesive is disposed between the thin films. At decision block 1810, if more layers are desired for the display stack, then the method 1800 returns to step 1804 and another adhesive is selected. The same adhesive, or a different adhesive, may be used depending on the different mechanical properties of the display stack that are desired. For example, each adhesive may have different shock absorbing capabilities, or in other words, ability to absorb different frequency shocks. As such, a display stack may be designed that is capable of absorbing a variety of shocks or impacts. In yet another embodiment, two different adhesives may be used in between two thin films. Typically, if two different moduli adhesives are positioned adjacent each other, the chemical properties of the two average and the different moduli are not maintained. However, if two different adhesives with different chemistries (i.e., an acrylate polymer and a silicon polymer) are selected, the differing moduli are maintained because the different chemistries will not mix. The method continues until, at decision block 1810, no more layers are desired, at which point the method ends.

This method was employed to fabricate an exemplary example display stack that reflects and absorbs energy from impacts and protects a flexible pOLED display from denting and damage (see Table 8). A commercially implemented thick plastic display stack having a known resistance to impact failure is used as a baseline. This commercially thick plastic display stack includes a 0.5-mm PC lens and is compared with a thin foldable display fabricated using adhesive A9 in combination with A1 and a 0.05-mm PET lens. The two 8-layer stacks, having a length by width of approximately 150 mm×100 mm were fabricated with layer structures given in Table 8. The two stacks were subjected to ball drop testing and found to protect the display from impact to equal extents. The functionality of the first 3 layers in the thin foldable display stack reflect impact momentum and the thicker bottom lens adhesive absorbs the transmitted energy thereby preventing the display from being damaged. The combination of adhesive A1 and A9 are found to satisfy two key functional requirements. First, mechanically isolate the individual layers of the foldable display stack, and second, enable it to achieve a bend radius <5-mm, and protect the pOLED from impacts.

TABLE 8

| Layer | Commercial Thick Plastic Display Stack | Thin Foldable Display Stack |
| --- | --- | --- |
| Top Lens | 500 um PC | 50 um PET/HC (both sides) |
| Top Lens Adhesive | 100 um C1 | 50 um A1 |
| Bottom Lens/Touch | 100 um PET | 50 um PET/HC (both sides) |
| Bottom Lens Adhesive | 100 um C1 | 200 um A9 |
| Display Transducer | 2 × 100 um Pressure Paper | 2 × 100 um Pressure Paper |
| Display Adhesive | 100 um A3 | 100 um A3 |
| Backplate | 40 um SS | 40 um SS |
| Backplate foam/adhesive | 230 um Adhesive/Foam | 230 um Adhesive/Foam |
| Total Thickness (um) | 1370 | 920 |

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An adhesive for assembling a thin film display stack, the adhesive comprising:
   a plurality of polymer chains, at least a portion of which are cross-linked;
   a non-volatile diluent having a volume % in the range of between about 40 and 95; and
   where the adhesive has a shear modulus of less than 10 kPa.

2. The adhesive of claim 1, where the plurality of polymer chains is selected from the group consisting of an acrylate polymer, and a silicone polymer.

3. The adhesive of claim 1, where the non-volatile diluent is selected from the group consisting of diphenyl-dimethyl-siloxane copolymer, butyl-terminated polydimethylsiloxane, and an alkane with pendant alkyl groups.

4. The adhesive of claim 3, where the non-volatile diluent limits a number of cross-linked polymer chains per volume to less than 5% to 60%.

5. The adhesive of claim 1, where the adhesive has a thickness of less than 0.5 mm.

6. The adhesive of claim 1, where the adhesive has a thickness equal to or less than about 0.2 mm.

7. The adhesive of claim 1, where the shear modulus is less than 5 kPa.

8. The adhesive of claim 1, where the shear modulus is less than 3 kPa.

9. The adhesive of claim 1, where the volume % of the non-volatile diluent is in the range of between about 70 and 85.

10. The adhesive of claim 1, where the volume % of the non-volatile diluent is about 80.

11. A display stack of a mobile computing device, the display stack comprising:
    a first thin film comprising an optically clear polymeric material;
    a second thin film comprising an optically clear polymeric material; and
    an adhesive layer disposed between the first thin film and the second thin film, where the adhesive layer comprises:
        a plurality of polymer chains, at least a portion of which are cross-linked;
        a non-volatile diluent having a volume % in the range of between about 40 and 95; and
        where the adhesive layer has a shear module of less than 10 kPa.

12. The display stack of claim 11, further comprising a hard coat formed on at least one surface of the first thin film or the second thin film.

13. The display stack of claim 12, where the hard coat further comprises a cross-linked polymer containing particulates, where the hard coat has at least 90% light transmission.

14. The display stack of claim 11, where the first thin film is selected from a group consisting of polyethylene terephthalate, cyclic olefin polymer, cyclic olefin copolymer, polycarbonate, colorless polyimide (CPI), transparent polyamide, and poly(methacrylate).

15. The display stack of claim 14, where the first thin film has a thickness of less than 0.1 mm.

16. The display stack of claim 11, where the first thin film has a color in a L*a*b* colorimetric system in the range of between about −1.0 to 1.0 for b*.

17. The display stack of claim 11, where the display stack comprises:
    a top lens formed of a 50 um thick layer of PET with a hard coating on each side of the layer;
    a bottom lens formed of a 50 um thick layer of PET with a hard coating on each side of the layer;
    a first adhesive layer having a thickness of 50 um disposed between the top lens and the bottom lens, where the adhesive comprises an acrylate polymer;
    a display;
    a second adhesive layer having a thickness of 200 um disposed between the bottom lens and the display, where the adhesive comprises an acrylate polymer;
    a backplate;

a third adhesive disposed between the display and the backplate having a thickness of about 100 um; and a backplate foam coupled to the backplate.

18. A method of forming a foldable display stack, the method comprising:

providing a first thin film comprising an optically clear polymeric material;

providing a second thin film comprising an optically clear polymeric material;

adhering the first thin film to the second thin film with an adhesive disposed between the first thin film and the second thin film, the adhesive comprising;

a plurality of polymer chains, at least a portion of which are cross-linked;

a non-volatile diluent having a volume % in the range of between about 40 and 95; and where the adhesive layer has a shear module of less than 10 kPa.

19. The method of claim 18, further comprising providing a hard coat formed on at least one surface of the first thin film or the second thin film.

20. The method of claim 18, where the non-volatile diluent is selected from the group consisting of diphenyl-dimethylsiloxane copolymer, butyl-terminated polydimethylsiloxane, and an alkane with pendant alkyl groups.

* * * * *